(12) United States Patent
Nomura et al.

(10) Patent No.: US 9,970,619 B2
(45) Date of Patent: May 15, 2018

(54) VEHICLE LAMP

(71) Applicant: KOITO MANUFACTURING CO., LTD., Tokyo (JP)

(72) Inventors: Akihiro Nomura, Shizuoka (JP); Tsukasa Tokida, Shizuoka (JP); Yuichi Shibata, Shizuoka (JP); Yukihiro Onoda, Shizuoka (JP); Takayuki Yagi, Shizuoka (JP); Satoshi Yamamura, Shizuoka (JP); Toshiaki Tsuda, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 40 days.

(21) Appl. No.: 15/090,434

(22) Filed: Apr. 4, 2016

(65) Prior Publication Data

US 2016/0290584 A1    Oct. 6, 2016

(30) Foreign Application Priority Data

Apr. 3, 2015 (JP) ................. 2015-076445

(51) Int. Cl.
| | |
|---|---|
| *F21S 8/10* | (2006.01) |
| *H01S 3/00* | (2006.01) |
| *H01S 5/00* | (2006.01) |
| *H01S 5/022* | (2006.01) |
| *H01S 5/068* | (2006.01) |

(52) U.S. Cl.
CPC ....... *F21S 48/1394* (2013.01); *F21S 48/1145* (2013.01); *H01S 3/0078* (2013.01); *H01S 5/005* (2013.01); *H01S 5/02296* (2013.01); *H01S 5/06825* (2013.01)

(58) Field of Classification Search
CPC .................................................. F21S 48/1394
See application file for complete search history.

(56) References Cited

U.S. PATENT DOCUMENTS

| | | | |
|---|---|---|---|
| 2011/0063115 A1* | 3/2011 | Kishimoto | ............... F21K 9/00 340/600 |
| 2012/0140501 A1* | 6/2012 | Nakazato | ............ F21S 48/1145 362/510 |

(Continued)

FOREIGN PATENT DOCUMENTS

| | | |
|---|---|---|
| CN | 102042549 A | 5/2011 |
| CN | 103883955 A | 6/2014 |

(Continued)

OTHER PUBLICATIONS

Office Action issued in corresponding Chinese Application No. 201610206380.3, dated Jan. 10, 2018 (14 pages).

*Primary Examiner* — Anh Mai
*Assistant Examiner* — Zachary J Snyder
(74) *Attorney, Agent, or Firm* — Osha Liang LLP

(57) ABSTRACT

A vehicle lamp includes a semiconductor laser element configured to emit laser light; a condenser lens configured to condense the laser light, a phosphor configured to form white light by converting wavelength of at least a portion of the laser light condensed, and a reflector configured to reflect the white light. A scattered light forming part is formed on a surface of the reflector, which is a surface at which a path obtained by extending an optical path of the laser light before the laser light hits the phosphor is intersected with the reflector.

6 Claims, 5 Drawing Sheets

(56) References Cited

U.S. PATENT DOCUMENTS

| | | | |
|---|---|---|---|
| 2015/0146302 A1* | 5/2015 | Hering | G02B 27/141 |
| | | | 359/634 |
| 2016/0033112 A1* | 2/2016 | Weissenberger | F21S 48/1225 |
| | | | 362/510 |
| 2016/0153634 A1* | 6/2016 | Albou | F21S 48/1159 |
| | | | 362/509 |
| 2016/0178155 A1* | 6/2016 | Owada | F21S 48/1329 |
| | | | 362/465 |
| 2017/0139096 A1* | 5/2017 | Frederiksen | F21S 48/14 |

FOREIGN PATENT DOCUMENTS

| | | |
|---|---|---|
| EP | 2461092 A2 | 6/2012 |
| JP | 2014-180886 A | 9/2014 |

\* cited by examiner

FIG. 5A
FIG. 5B
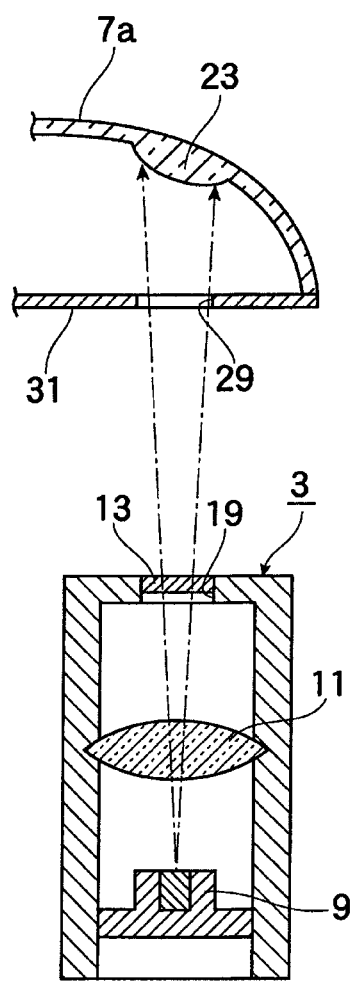
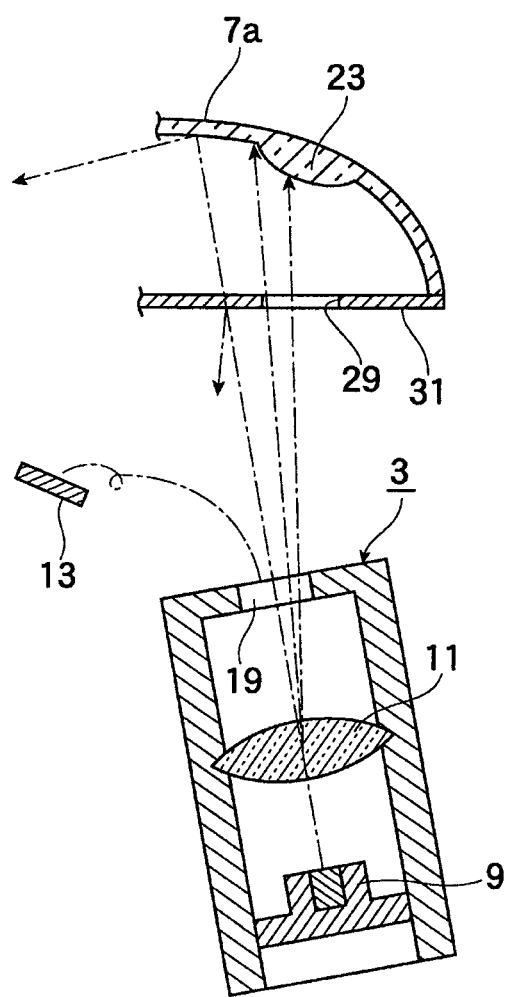

VEHICLE LAMP

CROSS-REFERENCE TO RELATED APPLICATION

The present application claims priority from Japanese Patent Application No. 2015-076445 filed on Apr. 3, 2015, the entire content of which is incorporated herein by reference.

BACKGROUND

Technical Field

The present invention relates to a vehicle lamp having a semiconductor laser element as a light source and, more particularly, to a vehicle lamp for generating a white light by combining a semiconductor laser element and a phosphor.

Related Art

In a vehicle lamp such as an automobile headlamp, it has been attempted to use a laser diode (LD) in place of a light emitting diode (LED) (see Patent Document 1). Since an LD light source has a high light-conversion efficiency and a small light-emitting area, the LD light source is advantageous for miniaturization of the lamp. In the vehicle lamp using the LD light source, a laser light, e.g., a blue laser light is irradiated from an LD element to a phosphor that is a wavelength-conversion element, a light, e.g., a yellow light is emitted due to excitation of the phosphor, and the blue laser light and the yellow light are mixed, thereby emitting a white light.

Laser light is a high-energy light having strong directivity. When being used as a light of a vehicle headlamp or the like, as described above, the laser light hits the phosphor and is scattered. In this way, the laser light is converted into a white light which is suitable for road surface irradiation and has a suitable energy. When the laser light does not hit the phosphor sufficiently, high-energy laser light is reflected in the reflector and is irradiated to a pedestrian, a vehicle or a road surface or the like in front of a vehicle. In order to avoid such a situation, the phosphor is strongly fixed to a mounting body in order to prevent the detachment or damage thereof.

In order to avoid the direct irradiation of high-energy laser light, various methods have been taken that include a method of strongly fixing the phosphor to the above-described mounting body such that the phosphor is not detached or damaged. However, although possibility of occurrence is extremely low, it is difficult to assert that the detachment of the phosphor is completely avoided. In order to confirm (in other words, in order to detect abnormality) that the phosphor is properly operated, i.e., that laser light hits the phosphor and is properly scattered, typically, a light detector is installed at a required place of an optical path to measure an amount of energy (intensity of light) or wavelength of light, thereby checking the presence or absence of abnormality. When abnormality is detected and it is determined that high-energy laser light is radiated without hitting the phosphor, the phosphor is estimated to be detached or damaged for some reason, thereby stopping the driving of the laser element.

In addition to this, there has been suggested that high-energy laser light is prevented from being reflected to the front from a reflector by forming a through hole penetrating the reflector or an escape hole (reference numeral H2 in Patent Document 1) in the reflector that is hit by laser light in an abnormal situation and thereby allowing the laser light to be escaped to the outside of the reflector.

Patent Document 1: Japanese Patent Laid-Open Publication No. 2014-180886

However, there is a problem that high-energy laser light is reflected in the reflector and is directly irradiated to the front when the light detector is not present, the light detector is damaged or the light detector is not quickly operated.

Further, in the case of forming the above-described escape hole, there is a disadvantage that a portion of the white light reaching the reflector in a normal driving is wasted. Furthermore, there is a possibility that the laser light escaped to the outside of the reflector in an abnormal situation is reflected multiple times for each member, and finally, high-energy laser light is irradiated to the outside of a lamp chamber.

SUMMARY

Exemplary embodiments of the invention provide a vehicle lamp which is capable of suppressing the laser light from being reflected in the reflector and being directly irradiated to the front even when a phosphor is detached from a predetermined position or even when the phosphor is damaged so that it cannot fulfill a normal function.

A vehicle lamp according to a first aspect of the invention comprises:
  a semiconductor laser element configured to emit laser light;
  a condenser lens configured to condense the laser light;
  a phosphor configured to form white light by converting wavelength of at least a portion of the laser light condensed; and
  a reflector configured to reflect the white light,
  wherein a scattered light forming part is formed on a surface of the reflector, which is a surface at which a path obtained by extending an optical path of the laser light before the laser light hits the phosphor is intersected with the reflector.

(Operation)

In such a configuration, in a normal situation, i.e., while the phosphor is fixed in a predetermined position and serves to convert the wavelength of at least a portion of the laser light, the strong directivity of high-energy laser light is weakened to generate a low-energy white light, and the white light hits the reflector over a relatively wide area, so that nearly all of the white light is reflected to the front to irradiate a road surface or the like.

However, when the phosphor is detached from a predetermined position or the phosphor is functionally deteriorated even at the time of being present in the predetermined position, in the related-art configuration that the scattered light forming part is not formed in the surface of the reflector, high-energy laser light is directly reflected, or laser light that is not sufficiently converted into lower-energy light is concentrated on a very narrow range of the reflector and is directly reflected. Therefore, the high-energy laser light is irradiated to a road surface or a pedestrian or the like.

On the contrary, the present invention is configured as follows. Specifically, there is a case that the phosphor is detached or is functionally deteriorated, and thus, laser light (e.g., blue or purple short-wavelength laser light) to be converted into low-energy light by hitting the phosphor approaches a very narrow range of the reflector while maintaining high energy. Even in this case, since the scattered light forming part is formed in a surface of the reflector corresponding to an extension path of an optical path of laser light, substantially all of laser light is diffusely reflected by hitting the scattered light forming part, and is scattered substantially in all directions on the inside of the reflector. With this scattering, directivity of the laser light is removed, and the laser light is converted into the low-energy scattered light. In this way, there is no case that high-energy laser light is irradiated to the front.

In this case, most of the scattered light is not directly irradiated to the front from the lamp chamber just by single reflection by the reflector. Significant amount of scattered light is indirectly irradiated to the front from the lamp chamber by multiple reflections by the reflector or the like. In a normal driving, the white light is reflected in the scattered light forming part, and thus, scattered light is generated. For the same reason, substantially all of the scattered light can be used to irradiate the front, so that waste hardly occurs.

The scattered light forming part is shaped such that substantially all of laser light reaching the scattered light forming part hits the scattered light forming part. Normal laser light has different divergence angles in the vertical and horizontal directions of an emitter, and a radiation pattern thereof is generated in an elliptical or rectangular shape. Therefore, it is desirable that the scattered light forming part has an elliptical or rectangular shape slightly larger than the elliptical shape of laser light reaching the reflector.

Furthermore, in the present configuration, there is no need to form an opening corresponding to the related-art escape hole in the reflector. Especially, there is no case that the white light, which is wavelength-converted in a normal driving, reaches the outside of the reflector, and hence, is uselessly consumed. Therefore, it is possible to contribute to the improvement of energy efficiency.

According to a second aspect of the invention, the scattered light forming part is an auxiliary phosphor disposed on the surface of the reflector.

(Operation)

The auxiliary phosphor may be the same as or different from the phosphor specified in the first aspect. In the present configuration, high-energy laser light reaching the vicinity of the reflector in an abnormal situation is scattered by hitting the auxiliary phosphor. Therefore, directivity of the laser light is removed and low-energy scattered light is generated. In this way, the high-energy laser light is not irradiated to the front. Furthermore, since the high-energy laser light is wavelength-converted by hitting the auxiliary phosphor, the low-energy laser light is generated before the scattering. When the auxiliary phosphor is the same as the phosphor, the scattered light becomes a white light, and thus, the same light as in the normal situation is obtained.

According to a third aspect of the invention, the scattered light forming part is a curved surface or an irregular surface, which is formed on the surface of the reflector.

(Operation)

The curved surface or irregular surface in the present configuration can be formed by forming and attaching the same or different material as the reflector on the surface of the reflector, or integrally molding a reflector having a curved surface or an irregular surface, or scratching and roughening the surface of the reflector, or the like. In the present configuration, the high-energy laser light, which is irradiated to the curved surface or irregular surface in an abnormal situation, is scattered in respective surfaces to generate scattered light. Therefore, similarly, the high-energy laser light is not irradiated to the front.

According to a fourth aspect of the invention, the scattered light forming part is a diffusing agent disposed on the surface of the reflector.

(Operation)

The diffusing agent in the present configuration includes any material to cause light scattering on the surface of the reflector. The diffusing agent can be formed by coating and drying solvent including suspended fine particles with light diffusion ability on the surface of the reflector or by coating and drying paint on the surface of the reflector.

According to a fifth aspect of the invention, in place of the scattered light forming part described in the first aspect, a diffraction grating is disposed on the surface of the reflector.

(Operation)

The diffraction grating is a spectral element where a large number of irregular parallel grooves in a micrometer order are formed on the surface. The diffraction grating can diffract the light of a specific wavelength in a specific direction. In the present configuration, the diffraction grating, in which fine parallel grooves corresponding to the target wavelength of laser light are formed, is disposed on, by a bonding or the like, the place of the surface of the reflector, to which the laser light is irradiated in an abnormal situation. In this way, out of the laser light, which does not hit the phosphor or hits the functionally deteriorated phosphor, and thus, reaches the vicinity of the reflector while maintaining high energy, the light corresponding to the target wavelength is diffracted in a direction other than the front direction in the diffraction grating. As a result, the high-energy laser light is prevented from being irradiated to the outside of the lamp chamber.

According to a sixth aspect of the invention, the vehicle lamp further comprises:
  at least one light detector,
    wherein out of the light irradiated to the diffraction grating, light of a specific wavelength range is diffracted and guided to the one or two or more light detectors.

(Operation)

Even if the low-energy of the laser light can be achieved by using the inventions described in the first to fifth aspects, it is undesirable to leave the vehicle lamp where the phosphor is detached or damaged. In the present configuration, the light of a specific wavelength, which is diffracted in a specific direction by the diffraction grating, is detected by the light detector, thereby recognizing abnormality of the phosphor. Further, by informing the abnormality to a driver by using an alarm or the like, it is possible to quickly deal with the abnormality.

According to a seventh aspect of the invention, the vehicle lamp further comprises:
  a shade provided between the phosphor and the scattered light forming part or the diffraction grating, the shade having a pin hole, the pin hole being formed in such a way that a straight line of connecting the maximum movement expected position of the condensing lens and an outer edge of the scattered light forming part or the diffraction grating passes through the inside of the pin hole.

(Operation)

In the vehicle lamp where the scattered light forming part or the diffraction grating is formed, when an emission direction of laser light by the laser element is a constant direction, typically, a vertical direction, the laser light hits the scattered light forming part or the diffraction grating, and thus, the high-energy laser light is not irradiated to the outside of the lamp chamber even if the phosphor is detached and thus the laser light reaches the vicinity of the reflector. This operation is the same as described above. However, when the laser element is inclined and thus the emission direction of the laser light is shifted from the vertical direction, a travelling direction of the laser light is also inclined. As a result, there is a possibility that the laser light reaches the surface of the reflector where the scattered light forming part or the diffraction grating is not present.

In this case, as in the present configuration, the shade having the pin hole is installed such that a straight line connecting the maximum movement expected position of the condenser lens as a travelling base point of the laser light and an outer edge of the scattered light forming part or the diffraction grating passes through the inside of the pin hole. In other words, the pin hole is formed such that all of laser light emitted from the condenser lens and passing through the pin hole reaches the scattered light forming part or the diffraction grating. With this configuration, the laser light, which is emitted from the laser element and reaches the outside of the region of the scattered light forming part or the diffraction grating when the pin hole is not present and the laser element is inclined or is horizontally moved, is blocked by the shade having the pin hole, and thus, cannot reach the scattered light forming part or the diffraction grating. As a result, the high-energy laser light is prevented from being reflected in the reflector and being irradiated to the front.

In the vehicle lamp according to the present invention, the scattered light forming part or the diffraction grating is disposed in the reflector. In this way, high-energy laser light, which may reach the reflector in an abnormal situation, is converted into low-energy light and is scattered or diffracted to the inside of the reflector. As a result, it is possible to prevent the high-energy laser light from being irradiated to the front of the lamp chamber. Further, since a laser light passing hole equivalent to a related-art escape hole is not required to be formed in the reflector, it is possible to effectively utilize the light generated.

Furthermore, in one aspect of the present embodiment where the pin hole is formed, it is possible to prevent the laser light from being irradiated to the front due to the inclination or movement of the laser element.

BRIEF DESCRIPTION OF THE DRAWINGS

FIGS. 5A and 5B are longitudinal sectional side views of a vehicle lamp according to yet another embodiment of the present invention, respectively.

DETAILED DESCRIPTION

Next, an embodiment of the present invention will be described.

Figure 1:
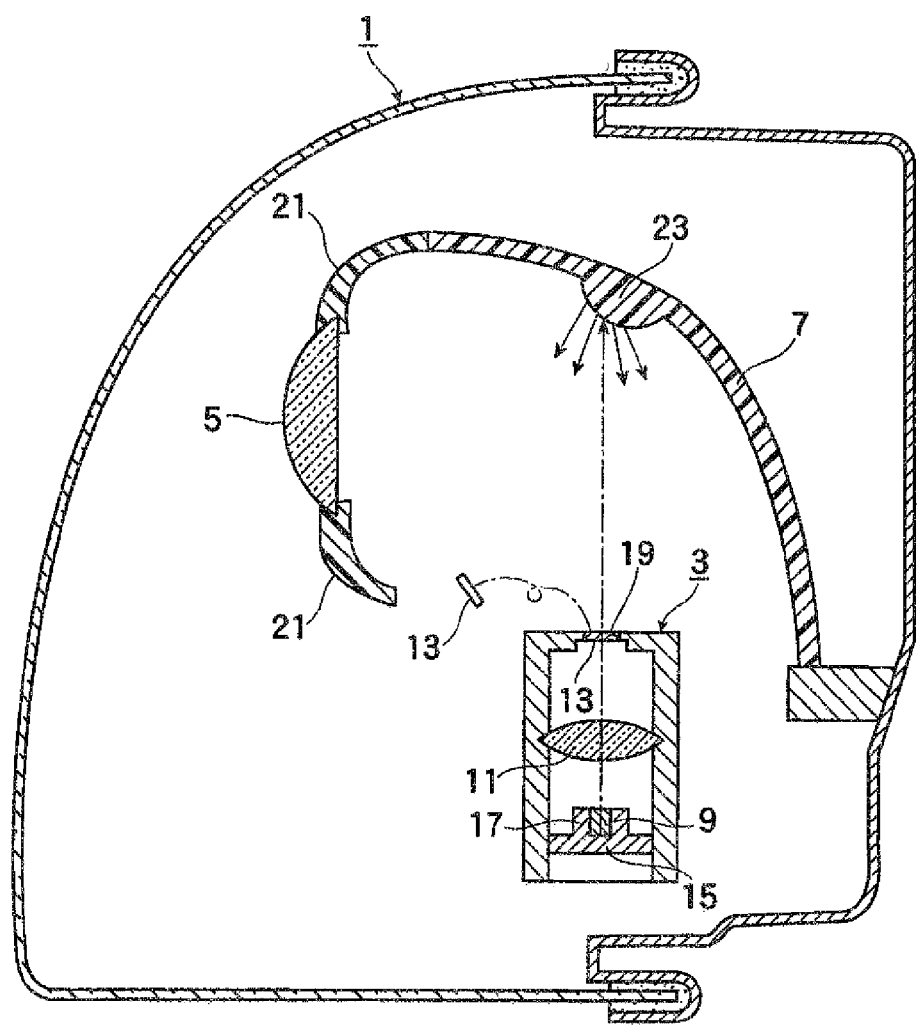
FIG. 1 is a longitudinal sectional side view of a vehicle lamp according to one embodiment of the present invention.

As shown in FIG. 1, a projector-type vehicle lamp 1 according to a first embodiment includes a light emitting device 3, a projection lens 5 disposed on an optical axis extending in a front-rear direction of a vehicle, and a reflector 7. The light emitting device 3 includes a semiconductor laser element 9 for emitting laser light, a condenser lens 11 for condensing the laser light from the semiconductor laser element 9, and a phosphor 13. The light from the condenser lens 11 is irradiated to the phosphor 13 and is transmitted upward through the phosphor 13. The semiconductor laser element 9 is a semiconductor light emitting element for emitting laser light. For example, an element for emitting laser light of a blue emission wavelength (about 450 nm) or laser light of a near-ultraviolet emission wavelength (about 405 nm) is used.

The light emitting device 3 is formed in a cylindrical shape and is configured such that the semiconductor laser element 9 is fixed to the inside of an elliptical peripheral wall 17 integrally molded on a circular plate 15 located at a lower inner side. The condenser lens 11 is fixed to the approximate center of a cylindrical inner wall surface of the light emitting device 3. Further, a rectangular or circular fixing hole 19 is formed at the center of the upper surface of the light emitting device 3. The phosphor 13 is bonded and fitted into the fixing hole 19 by a transparent adhesive such as silicone or low-melting-point glass. Since a typical laser light is generated not in a perfect circle shape but in an elliptical shape, the fixing hole may be an elliptical hole. In either case, the fixing hole 19 is shaped such that at least a portion of the laser light generated in the semiconductor laser element 9 is absorbed without being shielded, and is wavelength-converted and then transmitted.

For example, the phosphor 13 is a complex body of alumina ($Al_2O_3$) and YAG having activator such as cerium (Ce) introduced therein. The phosphor 13 has a plate-like shape or a layered shape including a lower surface and an upper surface, which are arranged substantially in parallel. A thickness of the phosphor 13 can be set to a proper thickness, depending on the desired chromaticity. The phosphor 13 emits white light which is generated by the color mixture of the wavelength-converted light described above and the laser light from the semiconductor laser element 9.

The condenser lens 11 condenses the laser light from the semiconductor laser element 9 and causes the condensed light to be irradiated to the phosphor 13. The condenser lens 11 is fixed to an inner wall between the phosphor 13 and the semiconductor laser element 9 in the cylindrical light emitting device 3.

The projection lens 5 is made of a transparent resin such as acrylic. In the example shown, the projector lens 5 is an aspherical lens having a front convex surface and a rear flat surface. The projection lens 5 is fixed to a holder 21 and is disposed on an optical axis extending in a front-rear direction of a vehicle.

A related-art reflector has a dome shape to cover the range over the upper side from the side of the light emitting device 3. The dome-shaped reflector is formed such that substantially all of the white light generated in the phosphor of the light emitting device is reflected to the front, transmitted through the projection lens and then irradiated to the front of a vehicle. In this way, a basic light distribution pattern (e.g., at least a portion of a low-beam light distribution pattern) is formed on a virtual vertical screen (disposed at a position of about 25 m in front of a vehicle front surface) facing the vehicle front surface.

The reflector 7 in the example shown has the same basic structure as the related-art reflector, but is different from the related-art reflector in that a scattered light forming part 23 protruding in a hemispherical shape is molded integrally to a lower surface of the reflector 7. The light, which travels in the order of the semiconductor laser element 9, the condenser lens 11 and the phosphor 13 and is converted into the white light, is irradiated to the lower surface of the reflector 7. The laser light from the semiconductor laser element 9 is transmitted through the phosphor 13 so that the laser light is converted into the white light and loses its directivity.

Therefore, the laser light travels directly upward and also is weakly refracted and diffused in an inverted cone shape, so that the laser light reaches the reflector 7. The white light, which travels directly upward or almost directly upward, reaches the hemispherical scattered light forming part 23 and is scattered in all directions along an inclination of the hemispherical surface of the scattered light forming part 23 irradiated (see solid lines in FIG. 1). Although most of the scattered light does not directly reach the projection lens 5, the scattered light is reflected by multiple members within a lamp chamber, and finally, most of the scattered light is irradiated to the front of the vehicle.

The white light, which travels in a path other than directly upward and almost directly upward, is reflected in a surface of the reflector 7 other than the scattered light forming part 23 protruding in the hemispherical shape and is typically irradiated to the front of the vehicle from the projection lens 5. Meanwhile, as will be described also in other embodiments described later, a percentage of the scattered light forming part formed in the lower surface of the reflector to the entire surface of the reflector is slight. Most of the white light, which is normally generated in the phosphor 13, is typically reflected in the lower surface of the reflector other than the scattered light forming part and is irradiated to the front of the vehicle.

Further, in an abnormal situation where the phosphor 13 is detached from the phosphor fixing hole 19 or the function of the phosphor 13 is damaged, the laser light reaching the phosphor 13 is not wavelength-converted by the phosphor, and substantially all of the laser light reaches the reflector 7 while holding strong directivity. In this case, when the scattered light forming part is not formed in the lower surface as in the related-art reflector, the laser light holding strong directivity is directly reflected in the lower surface of the reflector and is irradiated to the front of the vehicle.

However, in the present embodiment, as described above, the hemispherical scattered light forming part 23 is molded integrally to the place of the lower surface of the reflector 7, to which the laser light travels. Therefore, the laser light, which is not wavelength-converted in the phosphor 13 during the abnormal situation but is incident on the scattered light forming part 23, is scattered in all directions (see solid lines in FIG. 1). In this way, the laser light is converted into the scattered light in which directivity is greatly reduced. Accordingly, in the present embodiment, the laser light having strong directivity is not substantially irradiated to the outside of the vehicle even when abnormality occurs in the phosphor. However, it is undesirable to leave the phosphor in an abnormal situation. For example, it is desirable that a vehicle is stopped in a safe place, and then, the lamp is turned off when abnormality is detected in a photo sensor as described below.

Figure 2A:
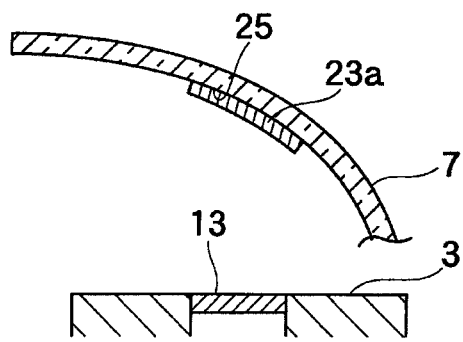
FIGS. 2A to 2C are partial longitudinal sectional side views of vehicle lamps according to other embodiments of the present invention, respectively.
Figure 2B:
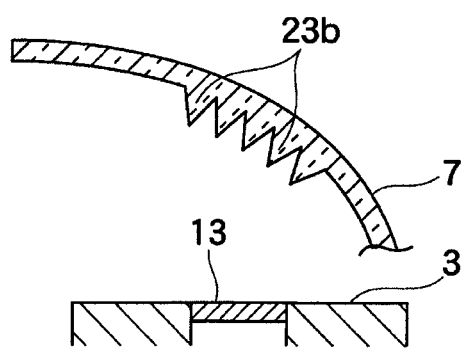
Figure 2C:
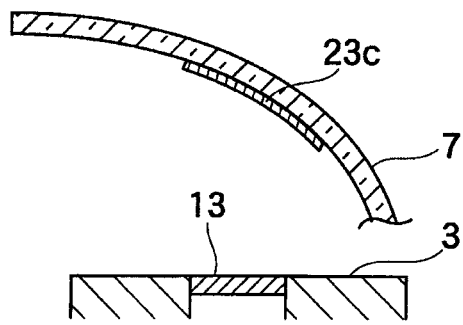

FIGS. 2A to 2C are partially-broken partial longitudinal sectional side views showing vehicle lamps according to second to fourth embodiments of the present invention, respectively. These embodiments have the same configurations as the first embodiment except for a scattered light forming part formed in a lower surface of a reflector of a lamp unit.

In the second embodiment shown in FIG. 2A, a concave groove 25 is formed in the lower surface of the reflector 7 and has a bottom surface serving as a reflective surface. Further, an auxiliary phosphor, which is the same as or similar to the phosphor 13 and serves as a scattered light forming part 23a, is embedded into the concave groove 25. In the third embodiment shown in FIG. 2B, a scattered light forming part 23b, which is serrated irregularities, is molded integrally on the lower surface of the reflector 7. In the fourth embodiment shown in FIG. 2C, a diffusing agent, which serves as a scattered light forming part 23c and is adapted to generate a scattered light by scattering the laser light, is formed on the lower surface of the reflector 7 by a coating or sticking or the like.

In the embodiment shown in FIG. 2A, the laser light, which is not wavelength-converted due to the detachment or damage of the original phosphor 13 and reaches the scattered light forming part 23a (auxiliary phosphor), hits the auxiliary phosphor 23a and is transmitted through the auxiliary phosphor. In this way, similarly to the case of the phosphor 13 in the normal situation, the laser light is converted into white light and is reflected in the bottom surface of the concave groove 25. Thus, the white light is again transmitted through the auxiliary phosphor 23a and irradiated toward the front. Therefore, also in the second embodiment, it is possible to prevent the laser light having strong directivity from being irradiated to the outside of the vehicle even when the phosphor 13 is detached or damaged. Furthermore, since the auxiliary phosphor 23a to perform a wavelength conversion is the same as or similar to the original phosphor 13, the same functionality is guaranteed.

Furthermore, during a normal driving, the laser light hits the phosphor twice, and hence, the wavelength conversion can be more reliably performed. Also, in the wavelength conversion by the original phosphor 13, there is a possibility that directivity is not weakened sufficiently, and hence slight directivity is left. Even in this case, the light in which directivity is left hits the auxiliary phosphor 23a, thereby obtaining the scattered light in which directivity is completely removed.

In the embodiment shown in FIG. 2B, the scattered light forming part 23b, which is serrated irregularities, is molded integrally to the lower surface of the reflector 7. Therefore, the laser light, which is not wavelength-converted due to the detachment or damage of the original phosphor 13 and reaches the scattered light forming part 23b (serrated irregular surface), is scattered in all directions on the surface of the scattered light forming part 23b, depending on the shape of the irregular surface. In this way, similarly to the first embodiment, the laser light is converted into the scattered light in which directivity is greatly reduced. In order to generate the scattered light of various angles, it is desirable that a plurality of surfaces, which is inclined in the same direction in the serrated irregular surface, is not parallel to each other but has slightly different angles.

The scattered light forming part molded integrally to the lower surface of the reflector 7 can include a file-like surface on which a large number of fine grooves are scribed so as to intersect with each other, or a hemispherical recess which is formed in an allowable depth range depending on the strength of the reflector 7, or the like, in place of the hemispherical scattered light forming part 23 shown in FIG. 1 or the serrated irregular surface 23b shown in FIG. 2. In either case, the shape of the scattered light forming part is desirable to allow the laser light reaching the reflector to be scattered at various angles as much as possible. For example, a concave groove or a convex protruding portion or the like, which has a rectangular cross-sectional shape, is undesirable since the reflection direction is limited.

In the embodiment shown in FIG. 2C, the diffusing agent serving as the scattered light forming part 23c is coated or stuck to the lower surface of the reflector 7. For example, the diffusing agent can be directly formed on the lower surface of the reflector 7 by coating and drying, on the surface of the reflector, solvent including suspended fine particles with light diffusion ability, such as barium sulfate, or by coating and drying paint on the surface of the reflector. Further, a diffusion sheet may be stuck to a predetermined place of the lower surface of the reflector 7. The diffusion sheet is obtained by coating and drying the paint or solvent where the fine particles are suspended and then forming the diffusing agent in a layered shape on one surface of the dried paint or solvent. Furthermore, one surface of the diffusion sheet may be roughened to form fine irregularities, and then, the diffusion sheet may be stuck to the lower surface of the reflector 7.

Also in this embodiment, when the laser light having strong directivity reaches the scattered light forming part 23c due to the detachment or damage of the phosphor 13, the scattered light forming part 23c serves as the diffusing agent. In this way, similarly to the above-described embodiment, the laser light is scattered in all directions, and hence, is converted into scattered light in which there is no or little directivity.

Figure 3:
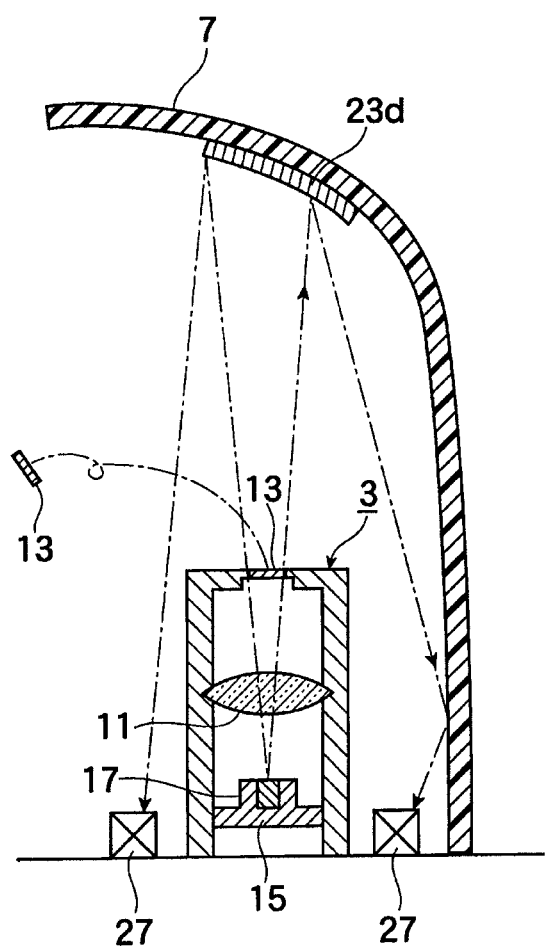
FIG. 3 is a longitudinal sectional side view of a vehicle lamp according to yet another embodiment of the present invention.
Figure 4:
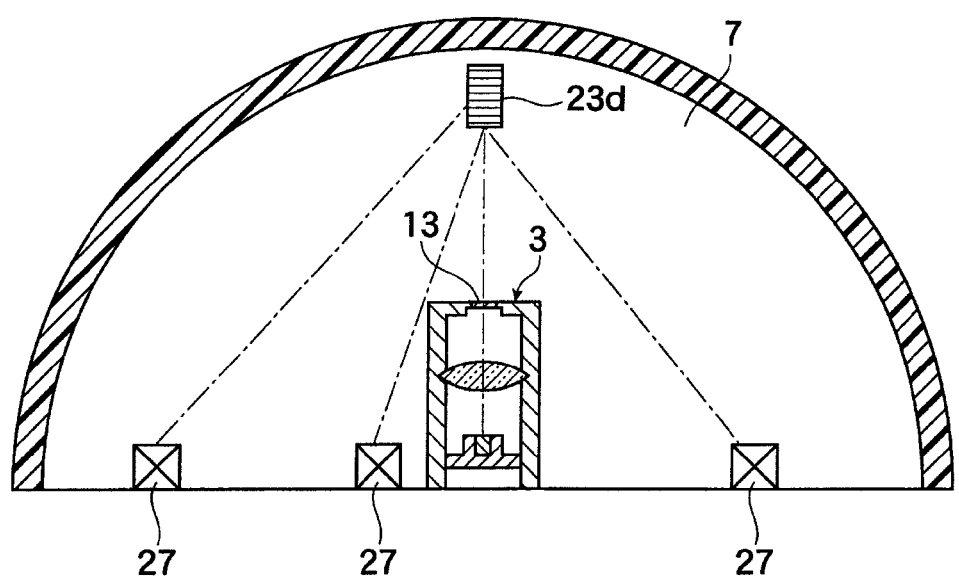
FIG. 4 is a longitudinal sectional front view of the vehicle lamp shown in FIG. 3.

A vehicle lamp 1 according to a fifth embodiment shown in FIGS. 3 and 4 has the same configurations as the vehicle lamp shown in FIG. 1. Therefore, the same or similar parts are denoted by the same or similar reference numerals and a duplicated description thereof will be omitted. In the fifth embodiment, a diffraction grating 23d is used as the scattered light forming part. Further, the laser light, which is diffracted in the diffraction grating 23d, is detected by one or two or more detection elements 27 such as a photo sensor.

Also in the fifth embodiment, during a normal situation, the phosphor 13 is operated to convert the wavelength of at least a portion of the laser light. Thus, the strong directivity of high-energy laser light is weakened, and thus, low-energy white light is generated. When the white light is reflected in the lower surface of the reflector 7 other than the diffraction grating 23d, nearly all of the white light is irradiated toward the front. The white light reaching the diffraction grating 23d is reflected in directions corresponding to inclined angles of fine gratings of the diffraction grating 23d. When the detection element 27 is installed, in advance, in one or two or more places within the vehicle lamp 1, especially when a plurality of detection elements 27 is installed, the light reflected is incident on at least one detection element 27, as shown in FIG. 3. By measuring the wavelength or intensity of the light, it is possible to confirm that a predetermined amount of white light is normally generated.

However, when the phosphor is detached from a predetermined position or the phosphor is functionally deteriorated even at the time of being present in the predetermined position, substantially all of the laser light having strong directivity reaches the diffraction grating 23d, is reflected in directions corresponding to inclined angles of fine gratings of the diffraction grating 23d, and then, is incident on the detection element 27, as in the white light. The light that is incident on the detection element 27 has the wavelength of the laser light and a greater amount of light than the white light. Therefore, by measuring the wavelength or intensity of the light, it is possible to confirm that not white light generated in the normal situation but laser light generated in the semiconductor laser element is directly incident on any one of the plurality of detection elements 27 without being wavelength-converted by the phosphor 13. When such a situation occurs, it is desirable to inform the abnormality to a driver by using an alarm or the like. Meanwhile, as can be seen from FIG. 4, an installation area of the diffraction grating 23d is very small relative to the entire area of the reflector 7. Most of the white light generated in the normal situation does not reach the diffraction grating 23d, but is reflected in the reflector 7 to irradiate the front. Further, typically, the semiconductor laser element 9 has an elliptical shape, and the laser light generated in the semiconductor laser element 9 also forms an elliptical light flux. In an abnormal situation where the phosphor 13 is not present, the laser light reaches the reflector 7 while maintain the elliptical shape. Therefore, it is desirable that the diffraction grating 23d formed in the reflector 7 also has an elliptical shape, as shown in FIG. 4.

FIGS. 5A and 5B are longitudinal sectional side views of a vehicle lamp according to a sixth embodiment, respectively. A light emitting device 3 in the present embodiment has the same configuration as in the vehicle lamp shown in FIG. 1. Therefore, the same or similar parts are denoted by the same or similar reference numerals and a duplicated description thereof will be omitted. Similarly to each of the preceding embodiments, in the sixth embodiment, it is suggested that the scattered light forming part is formed on the reflector to deal with the detachment or damage of the phosphor 13 and to deal with a situation where an optical path of the laser light is changed due to oblique or horizontal movement of the light emitting device 3.

Unlike the reflector 7 in the preceding embodiments, a reflector 7a in the present embodiment is substantially configured by a dome-shaped curved portion and has a small width in an up-down direction. However, the same scattered light forming part 23 as in the first embodiment is formed in the lower surface of the reflector 7a. A shade plate 31 having a pin hole 29 drilled therein is transversely provided continuously to a lower end of the reflector 7a. The reflector 7a and the shade plate 31 are integrally molded of a resin or the like. In this way, even when an external force is applied, a positional relation between the scattered light forming part 23 of the reflector 7a and the pin hole 29 of the shade plate 31 is set to be invariable. Meanwhile, in many cases, an actual diameter of the pin hole in the lamp unit is set to about 1 mm.

FIG. 5A shows a normal state where the light emitting device 3 stands in a normal position. In this state, the pin hole 29 is formed in the shade plate 31 such that its outer edge is located outside all of the straight lines connecting an outer peripheral surface of the scattered light forming part 23 and the center of the condenser lens at the maximum movement expected position of the condenser lens 11 after the light emitting device 3 shown in FIG. 5B is obliquely or horizontally moved. In the normal state shown in FIG. 5A, similarly to the case of the preceding embodiments, the laser light generated in the semiconductor laser element 9 is transmitted through the condenser lens 11, and then, reaches the phosphor 13. Then, the laser light is wavelength-converted to generate white light. Substantially all of the white light reaches the scattered light forming part 23 through the pin hole 29 formed in the shade plate 31 and is scattered in all directions. The scattered light is reflected by multiple members within a lamp chamber, and finally, most of the scattered light is irradiated to the front of the vehicle.

In the state shown in FIG. 5A, even when abnormal situations such as the detachment of the phosphor 13 from the phosphor fixing hole 19 or the functional damage of the phosphor 13 occur, substantially all of the laser light passes through the pin hole 29 and reaches the scattered light forming part 23 of the reflector 7a without being wavelength-converted by the phosphor 13 and while maintaining strong directivity. Then, the laser light is scattered in the scattered light forming part 23, and hence, the strong directivity thereof is weakened. In this way, the laser light becomes low-energy scattered light, and, in the same manner as in the normal situation, is irradiated to the front of the vehicle.

As such, in the example shown in FIG. 5A and the preceding embodiments, even when the laser light, which is not wavelength-converted due to the detachment or damage of the phosphor 13, reaches the reflector, the laser light is scattered by the scattered light forming part and is converted into low-energy scattered light. Therefore, high-energy laser light having strong directivity is prevented from being irradiated to the outside of the vehicle.

However, for example, in the first embodiment shown in FIG. 1, when the phosphor 13 is detached and the light emitting device 3 is inclined or horizontally moved, the position of the semiconductor laser element 9 or the condenser lens 11 is displaced. Thus, an optical axis of the laser light is changed, and the laser light transmitted through the condenser lens 11 reaches the reflector 7 without being wavelength-converted by the phosphor 13. Accordingly, there is a possibility that a portion of the laser light hits the lower surface of the reflector 7 other than the scattered light forming part 23, and hence, high-energy light having strong directivity is reflected toward the front of the vehicle.

However, in the sixth embodiment shown in FIG. 5B, as described above, the pin hole 29 is formed in such a way that the straight line of connecting the center of the condenser lens at the maximum movement expected position of the condensing lens 11 and the outer edge of the scattered light forming part 23 passes through the inside of the pin hole 29. Therefore, even when situations occurring only in very low probability, such as the detachment or damage of the phosphor 13 and the inclining or horizontal movement of the light emitting device 3, occur at the same time, in the sixth embodiment, out of the laser light from the condensing lens 11 displaced, the light reaching the lower surface of the reflector 7 other than the scattered light forming part 23 is shaded by the shade plate 31 around the pin hole 29, and hence, cannot reach the reflector 7. Therefore, high-energy laser light can be reliably prevented from being irradiated to the outside of the vehicle.

What is claimed is:

1. A vehicle lamp comprising:
    a semiconductor laser element configured to emit laser light;
    a condenser lens configured to condense the laser light;
    a phosphor configured to form white light by converting wavelength of at least a portion of the laser light condensed;
    a reflector configured to reflect the white light;
    a scattered light forming part formed on a surface of the reflector, which is a surface at which a path obtained by extending an optical path of the laser light before the laser light hits the phosphor is intersected with the reflector; and
    a shade provided between the phosphor and the scattered light forming part,
    wherein the condenser lens is configured to be moved to a maximum movement expected position, past which movement is not possible, and
    wherein the shade comprises a pin hole that is structured and positioned such that, at the maximum movement expected position of the condenser lens, a straight line connecting the condenser lens and an outer edge of the scattered light forming part passes through the pin hole.

2. The vehicle lamp according to claim 1, wherein the scattered light forming part is an auxiliary phosphor disposed on the surface of the reflector.

3. The vehicle lamp according to claim 1, wherein the scattered light forming part is a curved surface or an irregular surface, which is formed on the surface of the reflector.

4. The vehicle lamp according to claim 1, wherein the scattered light forming part is a diffusing agent disposed on the surface of the reflector.

5. A vehicle lamp comprising:
    a semiconductor laser element configured to emit laser light;
    a condenser lens configured to condense the laser light;
    a phosphor configured to form white light by converting wavelength of at least a portion of the laser light condensed;
    a reflector configured to reflect the white light;
    a diffraction grating provided on a surface of the reflector, which is a surface at which a path obtained by extending an optical path of the laser light before the laser light hits the phosphor is intersected with the reflector; and
    a shade provided between the phosphor and the diffraction grating,
    wherein the condenser lens is configured to be moved to a maximum movement expected position, past which movement is not possible, and
    wherein the shade comprises a pin hole that is structured and positioned such that, at the maximum movement expected position of the condenser lens, a straight line connecting the condenser lens and an outer edge of the diffraction grating passes through the pin hole.

6. The vehicle lamp according to claim 5, further comprising:
    at least one light detector,
    wherein out of the light irradiated to the diffraction grating, light of a specific wavelength range is diffracted and guided to the one or two or more light detectors.

* * * * *